(12) United States Patent
Tsai et al.

(10) Patent No.: US 12,342,599 B2
(45) Date of Patent: Jun. 24, 2025

(54) MANUFACTURING METHOD OF SEMICONDUCTOR DEVICE INCLUDING GATE OXIDE LAYER

(71) Applicant: UNITED MICROELECTRONICS CORP., Hsin-Chu (TW)

(72) Inventors: Ming-Hua Tsai, Tainan (TW); Jung Han, New Taipei (TW); Ming-Chi Li, Tainan (TW); Chih-Mou Lin, Tainan (TW); Yu-Hsiang Hung, Tainan (TW); Yu-Hsiang Lin, Kaohsiung (TW); Tzu-Lang Shih, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/757,573

(22) Filed: Jun. 28, 2024

(65) Prior Publication Data

US 2024/0355894 A1    Oct. 24, 2024

Related U.S. Application Data

(60) Continuation of application No. 18/078,057, filed on Dec. 8, 2022, now Pat. No. 12,057,483, which is a
(Continued)

(30) Foreign Application Priority Data

May 21, 2021 (CN) .......................... 202110558119.0

(51) Int. Cl.
*H10D 64/27* (2025.01)
*H10D 30/01* (2025.01)
*H10D 30/60* (2025.01)
*H10D 62/10* (2025.01)
*H10D 62/13* (2025.01)
*H10D 64/01* (2025.01)
(Continued)

(52) U.S. Cl.
CPC ....... *H10D 64/516* (2025.01); *H10D 30/0227* (2025.01); *H10D 30/601* (2025.01); *H10D 62/102* (2025.01); *H10D 62/151* (2025.01); *H10D 64/017* (2025.01); *H10D 64/021* (2025.01)

(58) Field of Classification Search
CPC ............. H10D 64/516; H10D 84/0144; H10D 64/017; H10D 64/021; H10D 30/0223; H10D 84/013
See application file for complete search history.

(56) References Cited

U.S. PATENT DOCUMENTS 5,994,747 A    11/1999 Wu
6,207,995 B1   3/2001 Gardner
(Continued)

*Primary Examiner* — Sonya McCall-Shepard
(74) *Attorney, Agent, or Firm* — Winston Hsu

(57) ABSTRACT

A semiconductor device includes a semiconductor substrate, a first gate oxide layer, and a first source/drain doped region. The first gate oxide layer is disposed on the semiconductor substrate, and the first gate oxide layer includes a main portion and an edge portion having a sloping sidewall. The first source/drain doped region is disposed in the semiconductor substrate and located adjacent to the edge portion of the first gate oxide layer. The first source/drain doped region includes a first portion and a second portion. The first portion is disposed under the edge portion of the first gate oxide layer in a vertical direction, and the second portion is connected with the first portion.

9 Claims, 11 Drawing Sheets

Related U.S. Application Data division of application No. 17/369,985, filed on Jul. 8, 2021, now Pat. No. 11,626,500.

(51) Int. Cl.
  *H10D 84/01* (2025.01)
  *H10D 84/03* (2025.01)
  *H10D 84/83* (2025.01)

(56) References Cited

U.S. PATENT DOCUMENTS

| | | |
|---|---|---|
| 6,455,383 B1 | 9/2002 | Wu |
| 6,555,438 B1 | 4/2003 | Wu |
| 7,067,365 B1 | 6/2006 | Lee |
| 2007/0034945 A1 | 2/2007 | Bohr |
| 2009/0039444 A1 | 2/2009 | Suzuki |
| 2010/0244147 A1 | 9/2010 | Yang |
| 2017/0200650 A1 | 7/2017 | Chang |
| 2019/0157421 A1 | 5/2019 | Wang |
| 2021/0272811 A1 | 9/2021 | Ji |

MANUFACTURING METHOD OF SEMICONDUCTOR DEVICE INCLUDING GATE OXIDE LAYER

CROSS REFERENCE TO RELATED APPLICATIONS

This application is a continuation application of U.S. application Ser. No. 18/078,057, filed on Dec. 8, 2022, which is a division of U.S. application Ser. No. 17/369,985, filed on Jul. 8, 2021. The contents of these applications are incorporated herein by reference.

BACKGROUND OF THE INVENTION

1. Field of the Invention

The present invention relates to a semiconductor device and a manufacturing method thereof, and more particularly, to a semiconductor device including a gate oxide layer and a manufacturing method thereof.

2. Description of the Prior Art

In the integrated circuit, transistors may be different from one another in structure for different operation voltages. For example, the transistors for relatively low operation voltage may be applied in core devices, input/output (I/O) devices, and so on. The transistors capable of high voltage processing may be applied in high operation voltage environment such as CPU power supply, power management system, AC/DC converter, and high-power or high frequency (HF) band power amplifier. However, in order to form transistors corresponding to different operation voltages on the same wafer or chip, the processes are often complicated and the processes of different transistors may affect each other. Therefore, how to improve the operation performance of the semiconductor device and/or simplify the manufacturing processes of the semiconductor device through the design of structure and/or the design of process is a continuous issue for those in the related fields.

SUMMARY OF THE INVENTION

A semiconductor device and a manufacturing method thereof are provided in the present invention. A gate oxide layer having a sloping sidewall is used to improve leakage current issue of the semiconductor device.

According to an embodiment of the present invention, a manufacturing method of a semiconductor device is provided. The manufacturing method includes the following steps. A first gate oxide layer is formed on a semiconductor substrate. The semiconductor substrate includes a first region and a second region, and the first gate oxide layer is formed on the first region. The first gate oxide layer includes a main portion and an edge portion, and the edge portion has a sloping sidewall. A second gate oxide layer is formed on the second region of the semiconductor substrate, and a thickness of the first gate oxide layer is greater than a thickness of the second gate oxide layer. A first dummy gate structure is formed on the first gate oxide layer, and a second dummy gate structure is formed on the second gate oxide layer. A first spacer structure is formed on a sidewall of the first dummy gate structure, and the first spacer structure is formed on the main portion of the first gate oxide layer. A second spacer structure is formed on a sidewall of the second dummy gate structure. A first source/drain doped region is formed in the semiconductor substrate, and the first source/drain doped region is disposed adjacent to the edge portion of the first gate oxide layer. The first source/drain doped region includes a first portion and a second portion. The first portion is disposed under the edge portion of the first gate oxide layer in a vertical direction, and the second portion is connected with the first portion. A second source/drain doped region is formed in the second region of the semiconductor substrate, and the second source/drain doped region is located adjacent to the second spacer structure. A first metal silicide layer and a second metal silicide layer are formed. At least a part of the first metal silicide layer is disposed in the second portion of the first source/drain doped region, and the edge portion of the first gate oxide layer is located between the first spacer structure and the first metal silicide layer in a horizontal direction. At least a part of the second metal silicide layer is disposed in the second source/drain doped region, and a first distance between the first metal silicide layer and the first dummy gate structure in the horizontal direction is greater than a second distance between the second metal silicide layer and the second dummy gate structure in the horizontal direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3-10 are schematic drawings illustrating a manufacturing method of a semiconductor device according to an embodiment of the present invention, wherein FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, and FIG. 10 is a schematic drawing in a step subsequent to FIG. 9.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
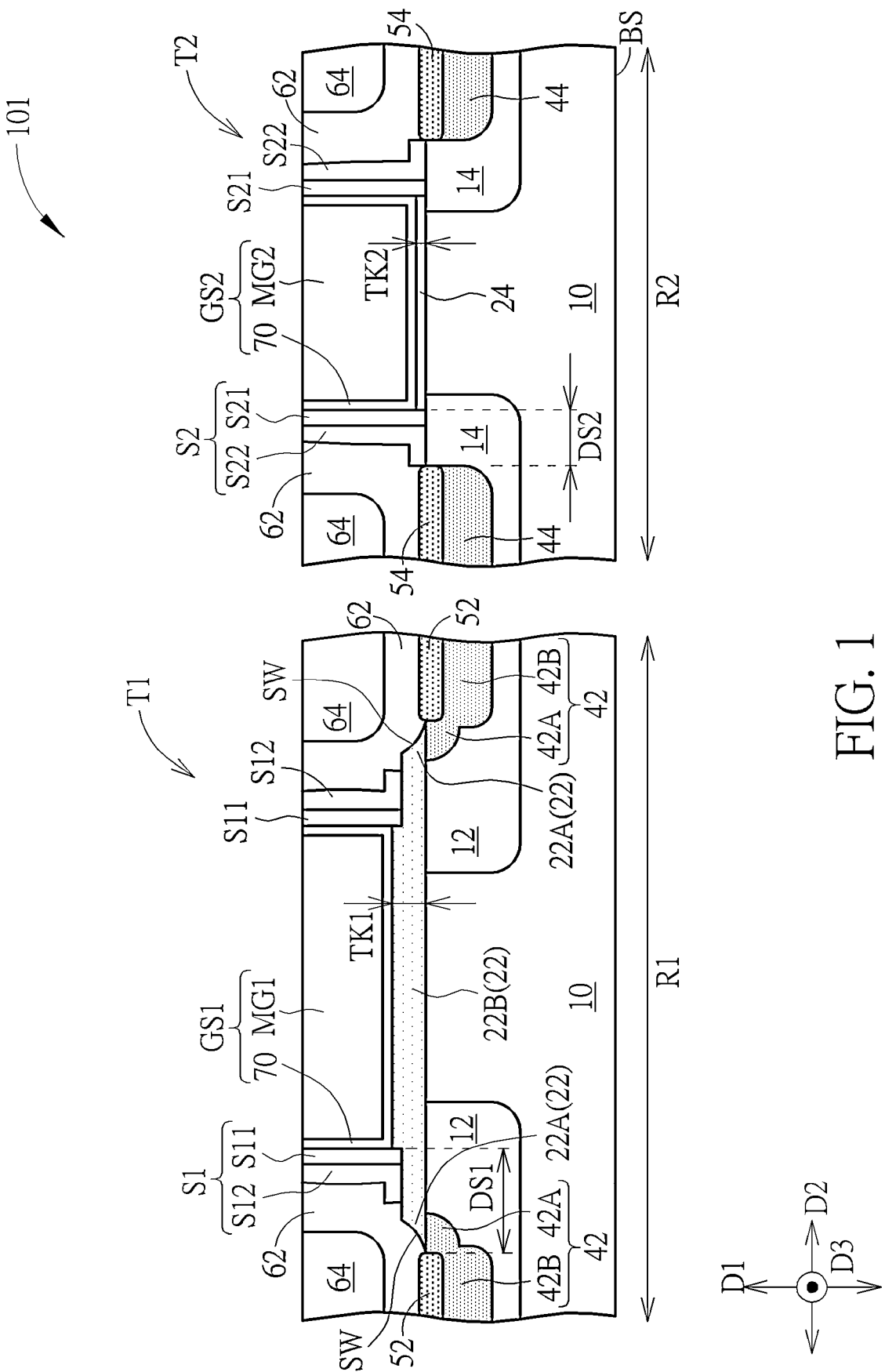
FIG. 1 is a schematic drawing illustrating a semiconductor device according to a first embodiment of the present invention.
Figure 2:
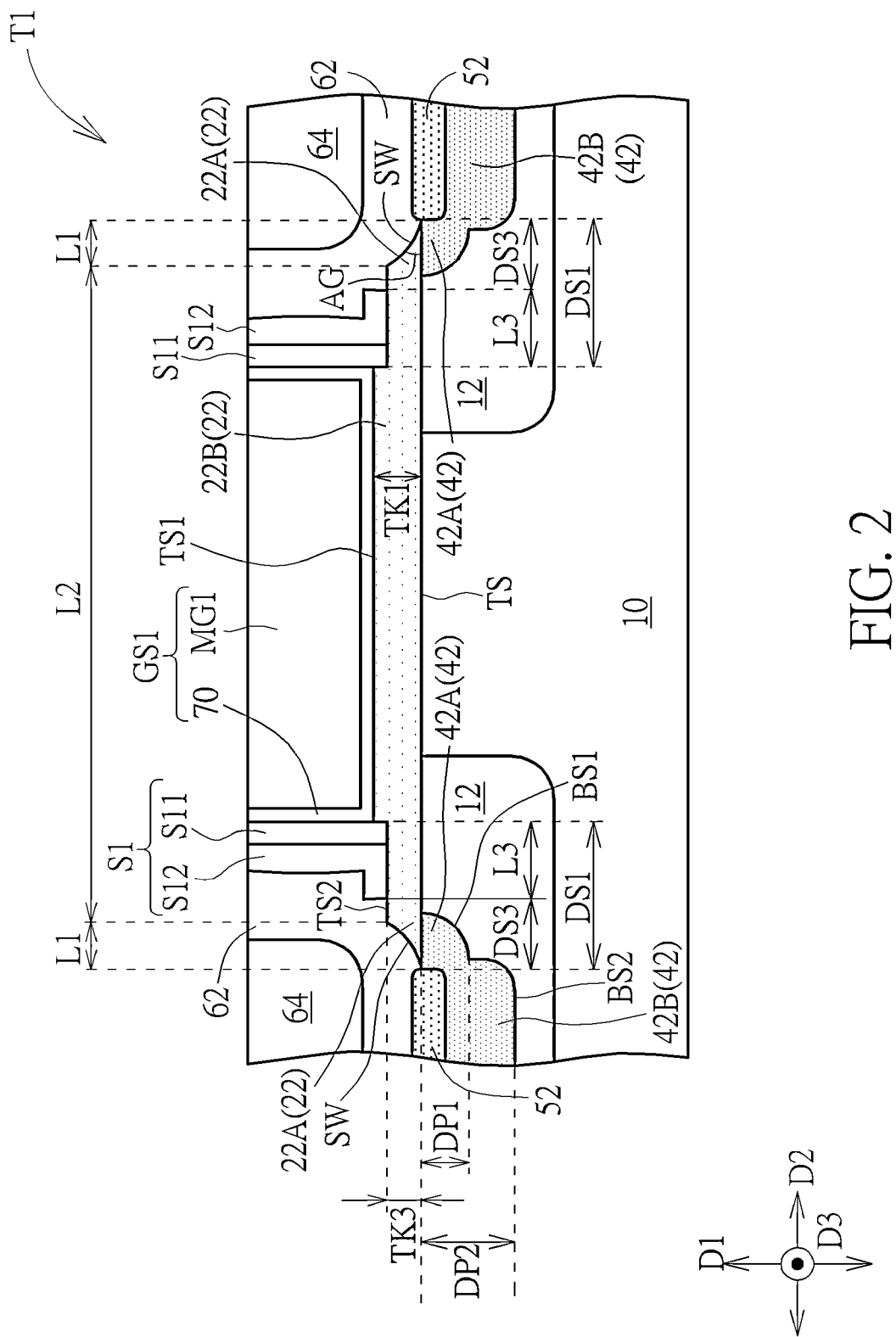
FIG. 2 is a schematic drawing illustrating a first transistor structure according to the first embodiment of the present invention.

Please refer to FIG. 1 and FIG. 2. FIG. 1 is a schematic drawing illustrating a semiconductor device 101 according to a first embodiment of the present invention, FIG. 2 is a schematic drawing illustrating a first transistor structure T1 in this embodiment, and FIG. 2 may be regarded as an enlarged diagram of the left half of FIG. 1. As shown in FIG. 1 and FIG. 2, the semiconductor device 101 is provided in this embodiment, and the semiconductor device 101 includes a semiconductor substrate 10, a first gate oxide layer 22, and a first source/drain doped region 42. The first gate oxide layer 22 is disposed on the semiconductor substrate 10. The first gate oxide layer 22 includes a main portion 22B and an edge portion 22A, and the edge portion 22A has a sloping sidewall SW. The first source/drain doped region 42 is disposed in the semiconductor substrate 10 and located adjacent to the edge portion 22A of the first gate oxide layer 22. The first source/drain doped region 42 includes a first portion 42A and a second portion 42B. The second portion 42B is connected with the first portion 42A, and the first portion 42A is disposed under the edge portion 22A of the first gate oxide layer 22 in a vertical direction (such as a first direction D1 shown in FIG. 1). The process of forming the first source/drain doped region 42 may be influenced by the edge portion 22A having the sloping sidewall SW for forming the first portion 42A of the first source/drain doped region 42 correspondingly. Therefore, the range and the shape of the first source/drain doped region 42 may be controlled via the first gate oxide layer 22 having the sloping sidewall SW, and the electrical performance of the semiconductor device 101 may be improved accordingly.

In some embodiments, the first direction D1 described above may be regarded as a thickness direction of the semiconductor substrate 10, and the semiconductor substrate 10 may have a top surface TS and a bottom surface BS opposite to the top surface TS in the first direction D1, and the first gate oxide layer 22 may be disposed at a side of the top surface TS, but not limited thereto. Horizontal directions substantially orthogonal to the first direction D1 (such as a second direction D2 and a third direction D3 shown in FIG. 1) may be substantially parallel with the top surface TS and/or the bottom surface BS of the semiconductor substrate 10, but not limited thereto. Additionally, in this description, a distance between the bottom surface BS of the semiconductor substrate 10 and a relatively higher location and/or a relatively higher part in the vertical direction (such as the first direction D1) is greater than a distance between the bottom surface BS of the semiconductor substrate 10 and a relatively lower location and/or a relatively lower part in the first direction D1. The bottom or a lower portion of each component may be closer to the bottom surface BS of the semiconductor substrate 10 in the first direction D1 than the top or upper portion of this component. Another component disposed above a specific component may be regarded as being relatively far from the bottom surface BS of the semiconductor substrate 10 in the first direction D1, and another component disposed under a specific component may be regarded as being relatively closer to the bottom surface BS of the semiconductor substrate 10 in the first direction D1, but not limited thereto.

Specifically, in some embodiments, the semiconductor substrate 10 may include a first region R1 and a second region R2. The first gate oxide layer 22 may be disposed on the first region R1 of the semiconductor substrate 10, and the first source/drain doped region 42 may be disposed in the first region R1 of the semiconductor substrate 10. Additionally, in some embodiments, the semiconductor device 101 may further include a lightly doped source/drain region 12, a first gate structure GS1, a first spacer structure S1, and a first metal silicide layer 52. The lightly doped source/drain region 12 may be disposed in the first region R1 of the semiconductor substrate 10 and partly located under the first gate oxide layer 22 in the first direction D1, and the first source/drain doped region 42 may be disposed in the lightly doped source/drain region 12. The first gate structure GS1 may be disposed on the main portion 22B of the first gate oxide layer 22, the first spacer structure S1 may be disposed on the main portion 22B of the first gate oxide layer 22 and located on a sidewall of the first gate structure GS1, and at least a part of the first metal silicide layer 52 may be disposed in the second portion 42B of the first source/drain doped region 42. The edge portion 22A of the first gate oxide layer 22 may be located between the first spacer structure S1 and the first metal silicide layer 52 in a first horizontal direction (such as the second direction D2 described above), and the first portion 42A of the first source/drain doped region 42 may be located between the first spacer structure S1 and the first metal silicide layer 52 in second direction D2 also.

In some embodiments, the semiconductor device 101 may include two lightly doped source/drain regions 12, two first source/drain doped regions 42, and two first metal silicide layers 52 located at the two opposite sides of the first gate structure GS1 in the first horizontal direction described above, respectively, for forming a first transistor structure T1 shown in FIG. 1, but not limited thereto. In other words, the first transistor structure T1 may include the lightly doped source/drain region 12, the first source/drain doped region 42, the first metal silicide layer 52, the first gate oxide layer 22, the first gate structure GS1, and the first spacer structure S1. In some embodiments, an impurity concentration of the first source/drain doped region 42 may be higher than an impurity concentration of the lightly doped source/drain region 12. For example, the lightly doped source/drain region 12 may be an n-type lightly doped region and the first source/drain doped region 42 may be an n-type heavily doped region, but not limited thereto. In some embodiments, the lightly doped source/drain region 12 may be a p-type lightly doped region and the first source/drain doped region 42 may be a p-type heavily doped region.

In some embodiments, the first portion 42A of the first source/drain doped region 42 may be regarded as a protruding part of the first source/drain doped region 42 protruding towards the first gate structure GS1. Therefore, the first portion 42A of the first source/drain doped region 42 may be located between the main portion 22B of the first gate oxide layer 22 and the second portion 42B of the first source/drain doped region 42 in the first horizontal direction (such as the second direction D2), and a bottom surface BS2 of the second portion 42B of the first source/drain doped region 42 may be lower than a bottom surface BS1 of the first portion 42A of the first source/drain doped region 42 in the first direction D1. In other words, a depth DP2 of the second portion 42B of the first source/drain doped region 42 in the first direction D1 may be greater than a depth DP1 of the first portion 42A of the first source/drain doped region 42 in the first direction D1, and the impurity concentration of the first portion 42A of the first source/drain doped region 42 may be substantially equal to the impurity concentration of the second portion 42B of the first source/drain doped region 42. In some embodiments, the depth in the first direction D1 may be regarded as a length in the first direction D1, and the length of the first portion 42A of the first source/drain doped region 42 in the first direction D1 may be less than the length of the second portion 42B of the first source/drain doped region 42 in the first direction D1 accordingly, but not limited thereto.

In some embodiments, the edge portion 22A of the first gate oxide layer 22 may surround the main portion 22B in the horizontal directions (such as the second direction D2 or other horizontal direction orthogonal to the first direction D1) and may be directly connected with the main portion 22B, and a length L2 of the main portion 22B in the second direction D2 may be greater than a length L1 of the edge portion 22A in the second direction D2. Additionally, in some embodiments, because of influence of manufacturing processes, a thickness of the main portion 22B of the first gate oxide layer 22 located under the first gate structure GS1 in the first direction D1 may be greater than a thickness of the main portion 22B of the first gate oxide layer 22 located under the first spacer structure S1 in the first direction D1, and a top surface TS2 of the first gate oxide layer 22 located under the first spacer structure S1 may be lower than a top surface TS1 of the first gate oxide layer 22 located under the first gate structure GS1 in the first direction D1, but not limited thereto. Additionally, in some embodiments, the sloping sidewall SW of the edge portion 22A may be directly connected with the top surface TS2 described above, and the edge portion 22A of the first gate oxide layer 22 may be regarded as a region of the first gate oxide layer 22 without being located under the top surface TS1 and the top surface TS2. Therefore, a thickness TK3 of the edge portion 22A of the first gate oxide layer 22 may be less than a thickness TK1 of the main portion 22B of the first gate oxide layer 22, and the thickness TK3 may be regarded as the maximum thickness of the edge portion 22A, but not limited thereto.

In some embodiments, the edge portion 22A having the sloping sidewall SW may be used for forming the first portion 42A of the first source/drain doped region 42 and enlarging a distance (such as a distance DS1 shown in FIG. 1) between the first metal silicide layer 52 and the first gate structure GS1 in the horizontal direction (such as the second direction D2), the electrical field distribution between the first metal silicide layer 52 and the first gate structure GS1 may be changed, and the leakage current (Ioff) of the first transistor structure T1 may be reduced accordingly. In other words, the distance between the first metal silicide layer 52 and the first gate structure GS1 may be increased without apparently increasing the distance between the first source/drain doped region 42 and the first gate structure GS1 in the horizontal direction by the edge portion 22A having the sloping sidewall SW. Additionally, in some embodiments, an included angle AG between the sloping sidewall SW of the edge portion 22A of the first gate oxide layer 22 and the top surface TS of the semiconductor substrate 10 may be less than or equal to 45 degrees for avoiding that the length L1 of the edge portion 22A in the horizontal direction is too short and the effect of enlarging the distance between the first metal silicide layer 52 and the first gate structure GS1 is affected accordingly, but not limited thereto. In some embodiments, because of the influence of the manufacturing processes, the sloping sidewall SW of the edge portion 22A of the first gate oxide layer 22 may include a concave surface sinking downwards, and the bottom surface BS1 of the first portion 42A of the first source/drain doped region 42 may include a curved surface disposed under and disposed correspondingly to the sloping sidewall SW of the edge portion 22A of the first gate oxide layer 22 in the first direction D1. In other words, the shape of the interface between the first portion 42A of the first source/drain doped region 42 and the lightly doped source/drain region 12 may be similar to the shape of the sloping sidewall SW of the edge portion 22A of the first gate oxide layer 22, but not limited thereto.

In some embodiments, the semiconductor device 101 may further include an etching stop layer 62 and a dielectric layer 64. The etching stop layer 62 may be disposed on the first metal silicide layer 52, the edge portion 22A of the first gate oxide layer 22, and the sidewall of the first spacer structure S1, and the dielectric layer 64 may be disposed on the etching stop layer 62. In some embodiments, a length L3 of the first spacer structure S1 in the second direction D2 may be less than the distance DS1 between the first metal silicide layer 52 and the first gate structure GS1 in the second direction D2 because the first metal silicide layer 52 is separated from the first spacer structure S1. Additionally, in some embodiments, the top surface TS2 of the main portion 22B of the first gate oxide layer 22 may be not completely covered by the first spacer structure S12 because the shape and the area of the first source/drain doped region 42 is not mainly defined by the first spacer structure S1, but not limited thereto. In this situation, a distance DS3 between the first metal silicide layer 52 and the first spacer structure S1 in the second direction D2 may be greater than the length L1 of the edge portion 22A of the first gate oxide layer 22 in the second direction D2, the length L2 of the main portion 22B of the first gate oxide layer 22 in the second direction D2 may be greater than the sum of the length of the first spacer structure S1 in the second direction D2 and the length of the first gate structure GS1 in the second direction D2, and the etching stop layer 62 may directly contact a part of the top surface TS2 and the sloping sidewall SW of the edge portion 22A, but not limited thereto.

In some embodiments, the semiconductor device 101 may further include a second transistor structure T2, and at least a part of the second transistor structure T2 is disposed on the second region R2 of the semiconductor substrate 10. The second transistor structure T2 may include a second gate oxide layer 24, a second gate structure GS2, a second spacer structure S2, a lightly doped source/drain region 14, a second source/drain doped region 44, and a second metal silicide layer 54. The second gate oxide layer 24 may be disposed on the second region R2 of the semiconductor substrate 10, and the thickness TK1 of the first gate oxide layer 22 may be greater than a thickness TK2 of the second gate oxide layer 24. In some embodiments, the gate oxide layers with different thicknesses may be used to realize the relatively high voltage operation and the relatively low voltage operation, respectively. Therefore, the operating voltage of the first transistor structure T1 may be higher than that of the second transistor structure T2, the first region R1 may be regarded as a relatively high voltage transistor region, and the second region R2 may be regarded as a relatively low voltage transistor region, but not limited thereto. The second gate structure GS2 may be disposed on the second gate oxide layer 24, and the second spacer structure S2 may be disposed on a sidewall of the second gate structure GS2 and a sidewall of the second gate oxide layer 24. The lightly doped source/drain region 14 may be disposed in the second region R2 of the semiconductor substrate 10 and a part of the lightly doped source/drain region 14 may be located under the second gate oxide layer 24 in the first direction D1. The second source/drain doped region 44 may be disposed in the semiconductor substrate 10 and located in the lightly doped source/drain region 14, and the second source/drain doped region 44 may be located adjacent to the second spacer structure S2.

In some embodiments, at least a part of the second silicide layer 54 may be disposed in the second source/drain doped region 44, and the second metal silicide layer 54 may be directly connected with the second spacer structure S2. Therefore, the distance (such as the distance DS1 described above) between the first metal silicide layer 52 and the first gate structure GS1 in the first horizontal direction may be greater than a distance (such as a distance DS2 shown in FIG. 1) between the second metal silicide layer 54 and the second gate structure GS2 in a second horizontal direction. In some embodiments, the first horizontal direction and the second horizontal direction described above may be the same direction (such as the second direction D2) or different horizontal directions. In some embodiments, the semiconductor device 101 may include two lightly doped source/drain regions 14, two second source/drain doped regions 44, and two second metal silicide layers 54 located at two opposite sides of the second gate structure GS2 in the second horizontal direction described above, respectively. Additionally, in some embodiments, the etching stop layer 62 and the dielectric layer 64 may be further disposed on the second region R2 of the semiconductor substrate 10 and cover the second metal silicide layer 54 and the sidewall of the second spacer structure S2, and the second gate oxide layer 24 may be covered by the second gate structure GS2 and the second spacer structure S2 without directly contacting the etching stop layer 62, but not limited thereto.

In some embodiments, the semiconductor substrate 10 may include a silicon substrate, an epitaxial silicon substrate, a silicon germanium substrate, a silicon carbide substrate, a silicon-on-insulator (SOI) substrate, or a substrate made of other suitable semiconductor materials. The lightly doped source/drain region 12, the lightly doped source/drain region 14, the first source/drain doped region 42, and the second source/drain doped region 44 may respectively include a doped region formed in the semiconductor substrate 10 by performing a doping process (such as an implantation process). In some embodiments, the lightly doped source/drain region 12 and the lightly doped source/drain region 14 may be formed concurrently by the same process and have the same conductivity type, the same impurity, and/or similar impurity concentrations, and the first source/drain doped region 42 and the second source/drain doped region 44 may be formed concurrently by the same process and have the same conductivity type, the same impurity, and/or similar impurity concentrations, but not limited thereto. The impurities (or dopants) described above may include n-type impurities or p-type impurities. The n-type impurities may include phosphorus (P), arsenic (As), or other suitable n-type impurities, and then p-type impurities may include boron (B), gallium (Ga), or other suitable p-type impurities.

In some embodiments, the first gate structure GS1 may include a gate dielectric layer 70 and a first metal gate structure MG1, and the second gate structure GS2 may include the gate dielectric layer 70 and a second metal gate structure MG2, but not limited thereto. The gate dielectric layer 70 may include a high dielectric constant (high-k) dielectric material or other suitable dielectric materials, and the first metal gate structure MG1 and the second metal gate structure MG2 may respectively include a metal gate structure formed with a work function layer (not illustrated) and a low electrical resistivity layer (not illustrated) stacked with each other, but not limited thereto. The work function layer described above may include titanium nitride (TiN), titanium carbide (TIC), tantalum nitride (TaN), tantalum carbide (TaC), tungsten carbide (WC), titanium tri-aluminide (TiAl$_3$), aluminum titanium nitride (TiAlN), or other suitable electrically conductive work function materials. The low electrical resistivity layer described above may include tungsten, aluminum, copper, titanium aluminide, titanium, or other suitable low electrical resistivity materials. In some embodiments, the first metal gate structure MG1 and the second metal gate structure MG2 may include the same work function layer stacked structure or different work function layer stacked structures according to the specifications of the first transistor structure T1 and the second transistor structure T2.

In some embodiments, the first metal silicide layer 52 and the second metal silicide layer 54 may include cobalt-silicide, nickel-silicide, or other suitable metal silicide. In addition, the first spacer structure S1 and the second spacer structure S2 may respectively include a single layer or multiple layers of dielectric materials, such as silicon oxide, silicon nitride, silicon oxynitride, or other suitable dielectric materials. For example, the first spacer structure S1 may include a spacer S11 and a spacer S12 disposed at an outer side of the spacer S11, wherein the material composition of the spacer S12 may be different from the material composition of the spacer S11; and the second spacer structure S2 may include a spacer S21 and a spacer S22 disposed at an outer side of the spacer S21, and the material composition of the spacer S22 may be different from the material composition of the spacer S21, but not limited thereto. In some embodiments, the spacer S11 and the spacer S21 may be formed concurrently by the same process and have the same material composition (such as silicon nitride), and the spacer S12 and the spacer S22 may be formed concurrently by the same process and have the same material composition (such as silicon oxide), but not limited thereto. Additionally, the etching stop layer 62 may include silicon nitride or other suitable insulation materials, and the dielectric layer 64 may include silicon oxide or other dielectric materials different from the etching stop layer 62.

Figure 3:
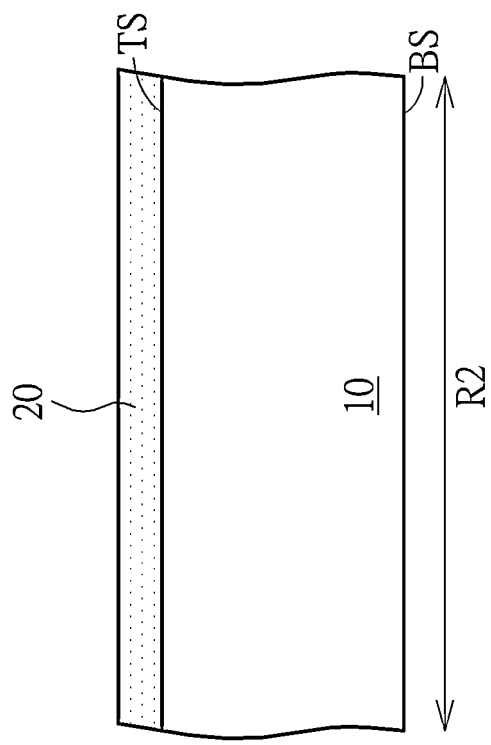
Figure 3:
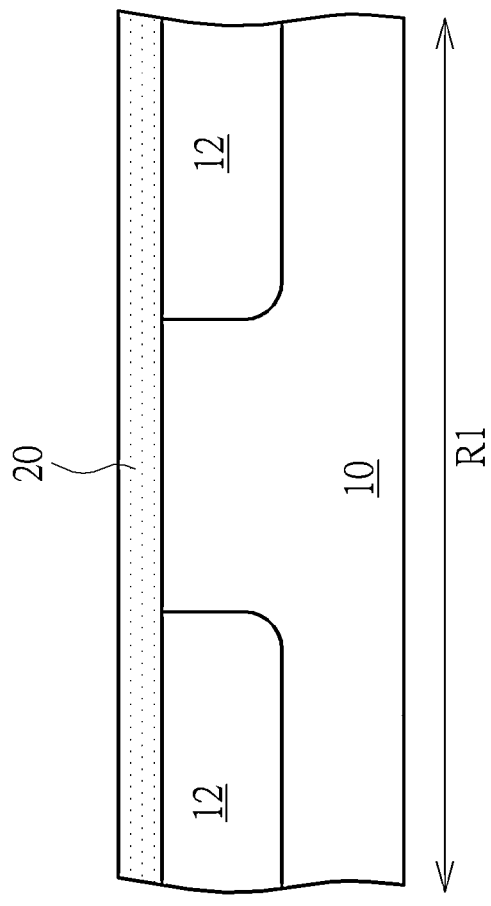
Figure 4:
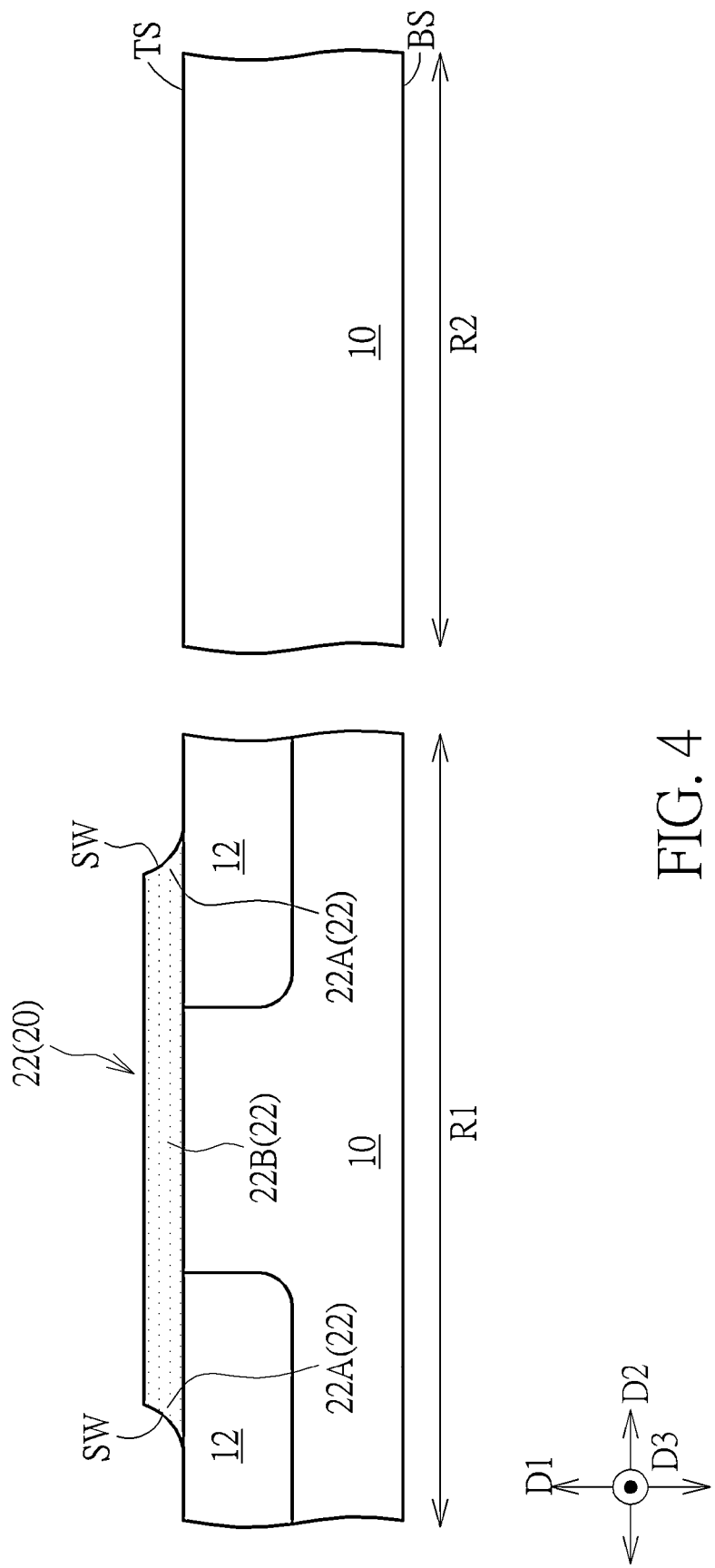
Figure 5:
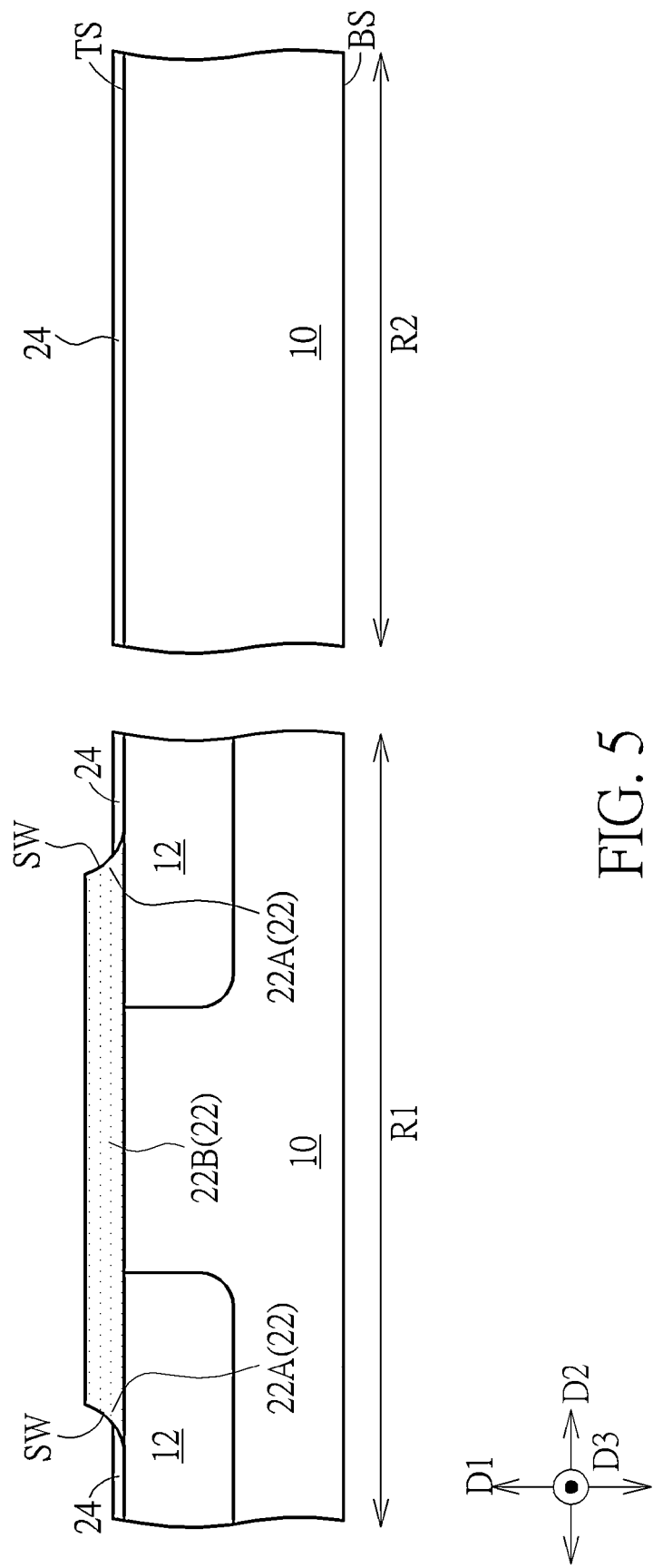
Figure 6:
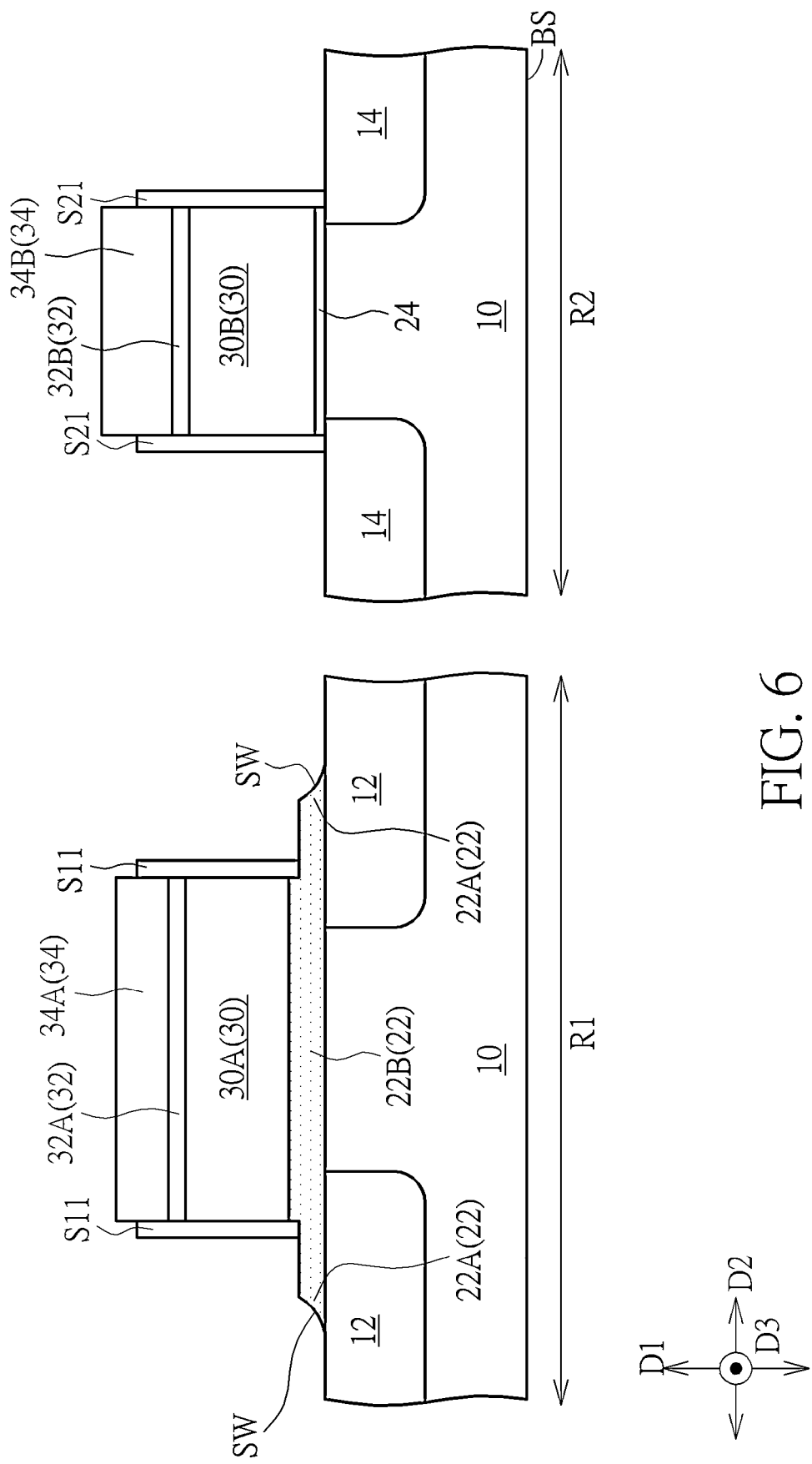
Figure 7:
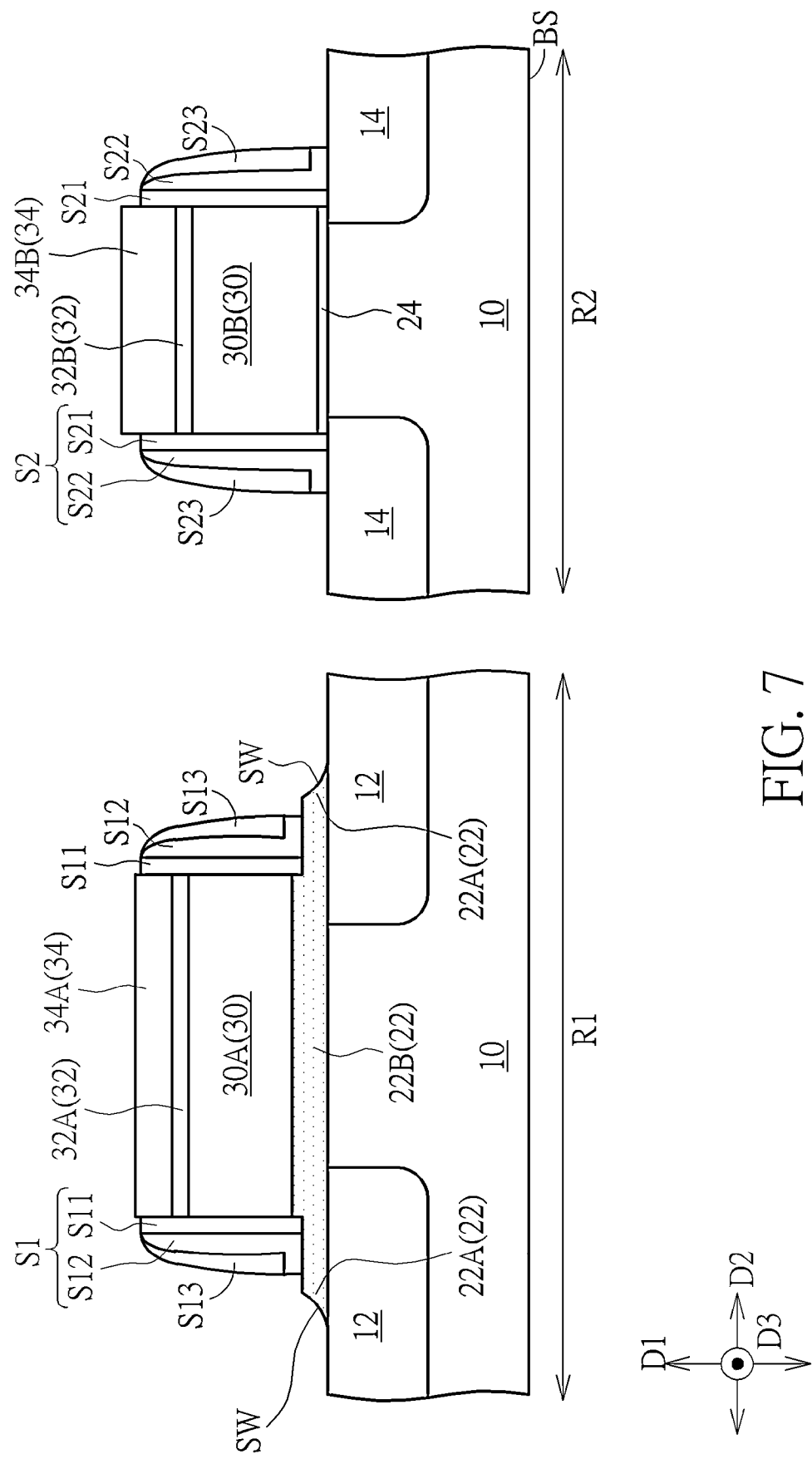
Figure 8:
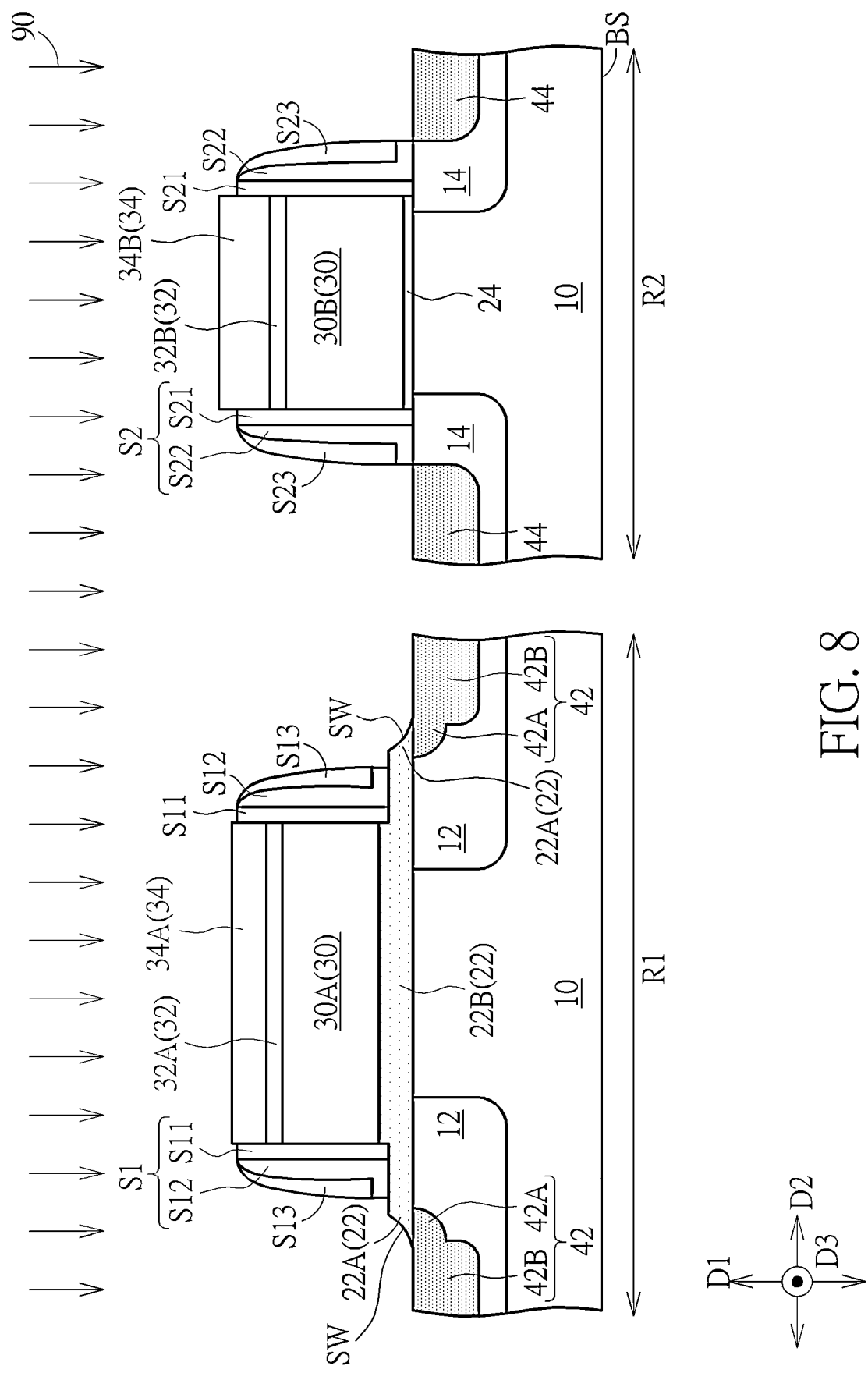
Figure 9:
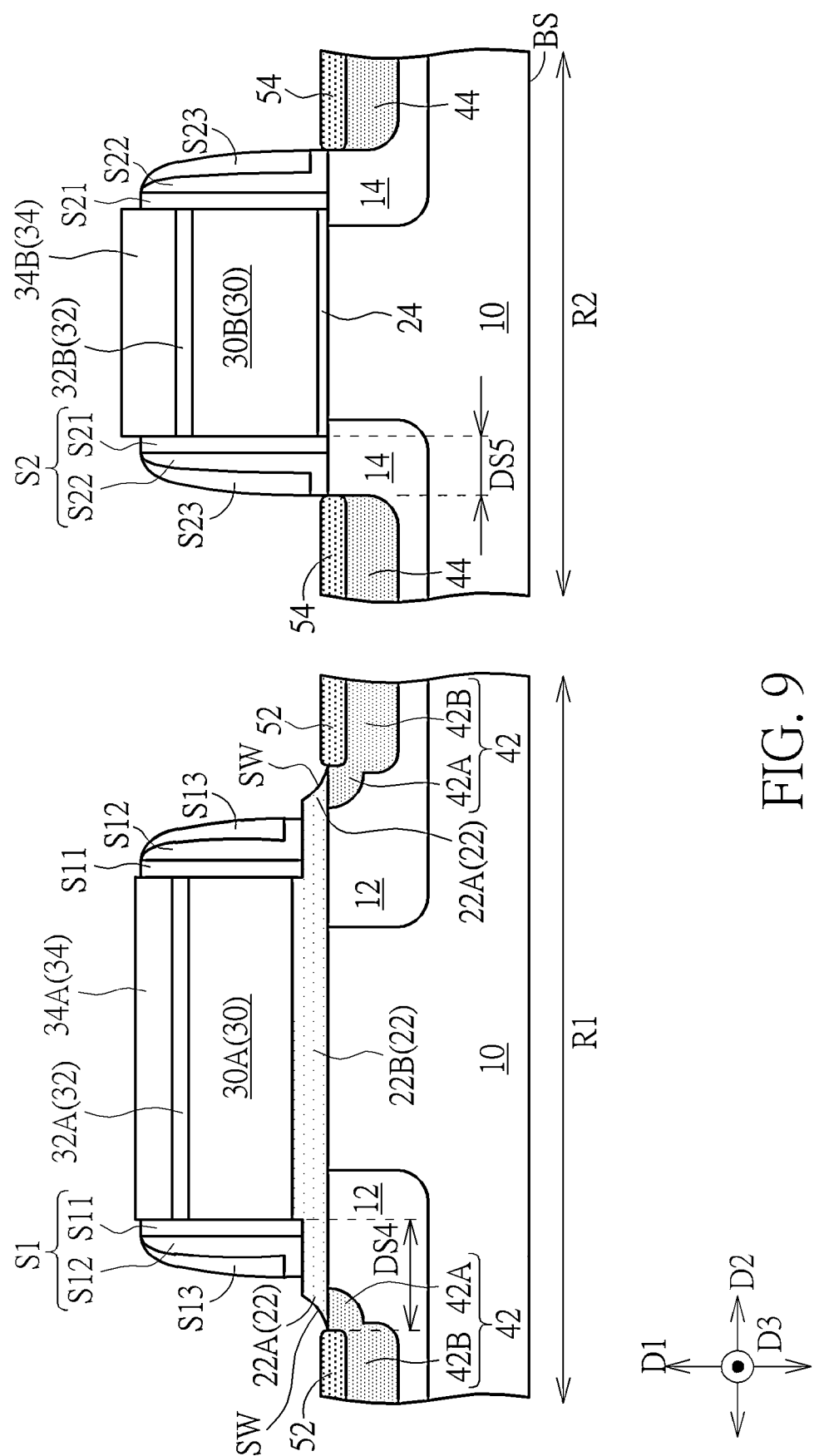
Figure 10:
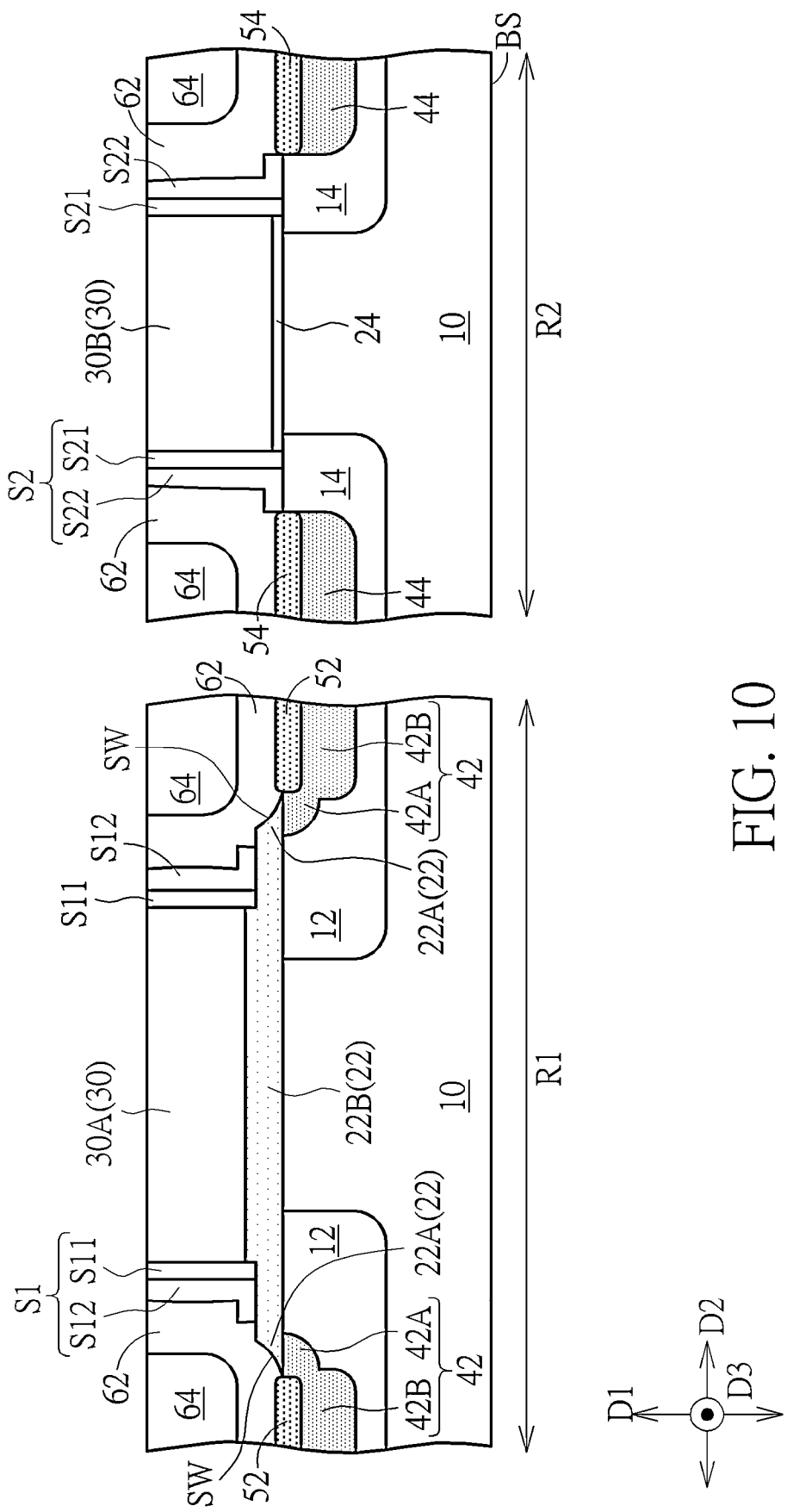

Please refer to FIGS. 1-10. FIGS. 3-10 are schematic drawings illustrating a manufacturing method of a semiconductor device according to an embodiment of the present invention, wherein FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, and FIG. 1 may be regarded as a schematic drawing in a step subsequent to FIG. 10. As shown in FIG. 1 and FIG. 2, the manufacturing method of the semiconductor device 101 in this embodiment may include the following steps. The first gate oxide layer 22 is formed on the semiconductor substrate 10. The first gate oxide layer 22 includes the main portion 22B and the edge portion 22A, and the edge portion 22A may have the sloping sidewall SW. The first source/drain doped region 42 is formed in the semiconductor substrate 10, and the first source/drain doped region 42 is disposed adjacent to the edge portion 22A of the first gate oxide layer 22. The first source/drain doped region 42 includes a first portion 42A and a second portion 42B. The first portion 42A is disposed under the edge portion 22A of the first gate oxide layer 22 in a vertical direction (such as the first direction D1), and the second portion 42B is connected with the first portion 42A.

Specifically, the manufacturing method in this embodiment may include but is not limited to the following steps. As shown in FIG. 3, an oxide layer 20 may be formed globally on the semiconductor substrate 10, and the oxide layer 20 may be formed on the first region R1 and the second region R2 accordingly. In some embodiments, the oxide layer 20 may be formed on the semiconductor substrate 10 by a thermal oxidation process, other suitable oxidation approaches, or other suitable film forming processes (such as deposition process). Additionally, in some embodiments, the lightly doped source/drain region 12 may be formed in the first region R1 of the semiconductor substrate 10 before the step of forming the oxide layer 20, and the lightly doped source/drain region 12 may be formed in the first region R1 of the semiconductor substrate 10 by a doping process, but not limited thereto. Subsequently, as shown in FIG. 3 and FIG. 4, the oxide layer 20 formed on the second region R2 and a part of the oxide layer 20 formed on the first region R1 may be removed concurrently for forming the first gate oxide layer 22 on the first region R1 and process simplification. In some embodiments, a mask layer (not illustrated) may be used to cover the area of the oxide layer 20, which is going to remain, and the mask layer may be used as an etching mask for performing an etching process configured to remove the oxide layer 20 on the second region R2 and the oxide layer 20 covering the region corresponding to the subsequent source/drain region on the first region R1. The edge portion 22A of the first gate oxide layer 22 formed by the etching process may have the sloping sidewall SW because of the etching property of the etching process. In some embodiments, the etching process described above may include a wet etching process or other suitable etching approaches capable of forming the required sloping sidewall SW.

Subsequently, as shown in FIGS. 3-5, after the step of removing the oxide layer 20 on the second region R2, the second gate oxide layer 24 may be formed on the second region R2, and the thickness of the first gate oxide layer 22 may be greater than the thickness of the second gate oxide layer 24. In some embodiments, the second gate oxide layer 24 may be formed on the semiconductor substrate 10 by a thermal oxidation process or other suitable oxidation approaches, and the second gate oxide layer 24 may be partly formed on the first region R1 accordingly, but not limited thereto. As shown in FIG. 5 and FIG. 6, a first dummy gate structure 30A, a gate cap layer 32A, and a gate cap layer 34A may then be formed on the first gate oxide layer 22, and a second dummy gate structure 30, a gate cap layer 32B, and a gate cap layer 34B may be formed on the second gate oxide layer 24. In some embodiments, the first dummy gate structure 30A and the second dummy gate structure 30B may be formed concurrently by the performing a patterning process to a material layer (such as a dummy gate material layer 30), and the material composition of the first dummy gate structure 30A may be identical to that of the second dummy gate structure 30B accordingly, but not limited thereto. The dummy gate material layer 30 may include polysilicon or other suitable dummy gate materials. In some embodiments, the gate cap layer 32A, the gate cap layer 34A, the gate cap layer 32B, and the gate cap layer 34B may respectively include silicon oxide, silicon nitride, or other suitable insulation materials. In addition, the material composition of the gate cap layer 32A may be different from that of the gate cap layer 34A, and the material composition of the gate cap layer 32B may be different from that of the gate cap layer 34B for providing required etching selectivity in the subsequent processes, but not limited thereto. For example, in some embodiments, the gate cap layer 32A and the gate cap layer 32B may be formed concurrently by the performing a patterning process to a material layer (such as a cap layer 32), the gate cap layer 34A and the gate cap layer 34B may be formed concurrently by the performing a patterning process to a material layer (such as a cap layer 34), and the material composition of the cap layer 34 (such as silicon oxide) may be different from the material composition of the cap layer 32 (such as silicon nitride), but not limited thereto.

Subsequently, the spacer S11 may be formed on sidewalls of the first dummy gate structure 30A, the gate cap layer 32A, and the gate cap layer 34A, and the spacer S21 may be formed on sidewalls of the second dummy gate structure 30B, the gate cap layer 32B, and the gate cap layer 34B. In some embodiments, a part of the first gate oxide layer 22 may be removed by the steps of forming the first dummy gate structure 30A, the gate cap layer 32A, and/or the gate cap layer 34A, and the top surface of the first gate oxide layer 22 located under the spacer S11 may be slightly lower than the top surface of the first gate oxide layer 22 located under the first dummy gate structure 30A in the first direction, but not limited thereto. Additionally, the second gate oxide layer 24 formed on the first region R1 may be removed by the steps of forming the first dummy gate structure 30A, the gate cap layer 32A, the gate cap layer 34A, and/or the spacer S11. In some embodiments, the lightly doped source/drain region 14 may be formed in the second region R2 of the semiconductor substrate 10 by a doping process after the step of forming the spacer S21, but not limited thereto.

As shown in FIG. 6 and FIG. 7, after the step of forming the lightly doped source/drain region 14, the spacer S12 and a spacer S13 may be formed at an outer side of the spacer S11, and the spacer S22 and a spacer S23 may be formed at an outer side of the spacer S21. In some embodiments, the spacer S13 and the spacer S23 may be formed concurrently by the same process and have the same material composition (such as silicon nitride), and the spacer S12, the spacer S13, the spacer S22, and the spacer S23 may be formed concurrently by performing a patterning process to two spacer material layers (such as a silicon oxide layer and a silicon nitride layer) conformally formed on the semiconductor substrate 10, the first gate oxide layer 22, the spacer S11, the gate cap layer 34A, the spacer S21, and the gate cap layer 34B, and the spacer S12 and the spacer S22 may respectively have a L-shaped structure in a cross-sectional diagram, but not limited thereto.

Additionally, in some embodiments, the spacer S13 and the spacer S23 may be removed concurrently by subsequent processes. Therefore, the spacer S11 and the spacer S12 may be regarded as the first spacer structure S1 formed on sidewalls of the first dummy gate structure 30A, the gate cap layer 32A, and the gate cap layer 34A, and the spacer S21 and the spacer S22 may be regarded as the second spacer structure S2 formed on sidewalls of the second dummy gate structure 30B the gate cap layer 32B, and the gate cap layer 34B, but not limited thereto. In some embodiments, the first spacer structure S1 may be formed on the main portion 22B of the first gate oxide layer 22, and the top surface of the first gate oxide layer 22 located under the first spacer structure S1 may be slightly lower than the top surface of the first gate oxide layer 22 located under the first dummy gate structure 30A in the first direction D1, but not limited thereto. In some embodiments, the main portion 22B and the edge portion 22A of the first gate oxide layer 22 may be slightly etched by the processes (such as etching processes) of forming the spacers described above, but the edge portion 22A of the first gate oxide layer 22 may have the sloping sidewall SW before the step of forming the first spacer structure S1 and after the step of forming the first spacer structure S1. In other words, as shown in FIGS. 4-7, in some embodiments, the sloping sidewall SW of the edge portion 22A of the first gate oxide layer 22 may be formed before the step of forming the first dummy gate structure 30A and the step of forming the first spacer structure S1, and the edge portion 22A of the first gate oxide layer 22 may still have the sloping sidewall SW after the first spacer structure S1 and the spacer S13 are formed.

Subsequently, as shown in FIG. 8, the first source/drain doped region 42 and the second source/drain doped region 44 may be formed in the first region R1 and the second region R2 of the semiconductor substrate 10, respectively. In some embodiments, the first source/drain doped region 42 and the second source/drain doped region 44 may be formed in the lightly doped source/drain region 12 and the lightly doped source/drain region 14, respectively. The impurity concentration of the first source/drain doped region 42 may be higher than that of the lightly doped source/drain region 12, and the impurity concentration of the second source/drain doped region 44 may be higher than that of the lightly doped source/drain region 14. In some embodiments, the second source/drain doped region 44 and the first source/drain doped region 42 may be formed concurrently by the some process (such as a doping process 90) for process simplification, but not limited thereto. The doping process 90 may include an ion implantation process or other suitable doping approaches. In some embodiments, the shape of the first source/drain doped region 42 may be mainly influenced by the edge portion 22A of the first gate oxide layer 22 and have the first portion 42A and the second portion 42B described above because the first gate oxide layer 22 is relatively thicker and the first spacer structure S1 does not cover the edge portion 22A. For example, the thickness of the edge portion 22A of the first gate oxide layer 22 may be gradually decreased in a direction away from the first dummy gate structure 30A because the edge portion 22A of the first gate oxide layer 22 has the sloping sidewall SW. Comparatively, the depth of the first portion 42A of the first source/drain doped region 42 may be gradually increased in the direction away from the first dummy gate structure 30A accordingly, and the depth of the second portion 42B of the first source/drain doped region 42 may be greater than that of the first portion 42A of the first source/drain doped region 42 because the second portion 42B of the first source/drain doped region 42 does not overlap the first gate oxide layer 22 in the first direction D1.

Subsequently, as shown in FIG. 8 and FIG. 9, the first metal silicide layer 52 and the second metal silicide layer 54 may be formed. In some embodiments, the first metal silicide layer 52 and the second metal silicide layer 54 may be formed concurrently by the same process and have the same material composition for process simplification, but not limited thereto. For example, a metal layer (not illustrated) may be formed globally, and the metal layer may directly contact the first source/drain doped region 42 and the second source/drain doped region 44. A thermal treatment may then be performed for reacting the metal layer with the first source/drain doped region 42 and the second source/drain doped region 44 and forming the first metal silicide layer 52 and the second metal silicide layer 54 accordingly, and the metal layer may be removed after the first metal silicide layer 52 and the second metal silicide layer 54 are formed. In some embodiments, the metal layer described above may include cobalt, nickel, or other suitable metal materials, and the first metal silicide layer 52 and the second metal silicide layer 54 may include cobalt-silicide, nickel-silicide, or other silicide of the metal material of the metal layer. In some embodiments, the edge portion 22A of the first gate oxide layer 22 may be located between the first spacer structure S1 and the first metal silicide layer 52 in a horizontal direction (such as the second direction D2), and the second metal silicide layer 54 may directly contact the second spacer structure S2. Therefore, a distance DS4 between the first metal silicide layer 52 and the first dummy gate structure 30A in the first horizontal direction (such as the second direction D2, but not limited thereto) may be greater than a distance DS5 between the second metal silicide layer 54 and the second dummy gate structure 30B in the second horizontal direction (such as the second direction D2, but not limited thereto).

Subsequently, as shown in FIG. 9 and FIG. 10, the etching stop layer 62 and the dielectric layer 64 may be formed, and a planarization process may be performed for removing the gate cap layer 32A, the gate cap layer 32B, the gate cap layer 34A, the gate cap layer 34B, a part of the first spacer structure S1, a part of the second spacer structure S2, a part of the etching stop layer 62, and a part of the dielectric layer 64 and exposing the first dummy gate structure 30A and the second dummy gate structure 30B. The planarization process described above may include a chemical mechanical polishing (CMP) process, an etching back process, or other suitable planarization approaches. Additionally, in some embodiments, the spacer S13 and the spacer S23 may be removed by the influence of other process before the step of forming the etching stop layer 62, and the etching stop layer 62 may directly cover the first spacer structure S1 and the second spacer structure S2 accordingly, but not limited thereto. As shown in FIG. 10 and FIG. 1, the first dummy gate structure 30A and the second dummy gate structure 30B may be removed and the first gate structure GS1 and the second gate structure GS2 may be formed correspondingly for forming the semiconductor device 101 described above. In addition, the manufacturing method of the semiconductor device 101 in this embodiment is not limited to the condition shown in FIGS. 3-10 described above, and other suitable manufacturing approaches may be used to form the semiconductor device 101 according to other design considerations.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 11:
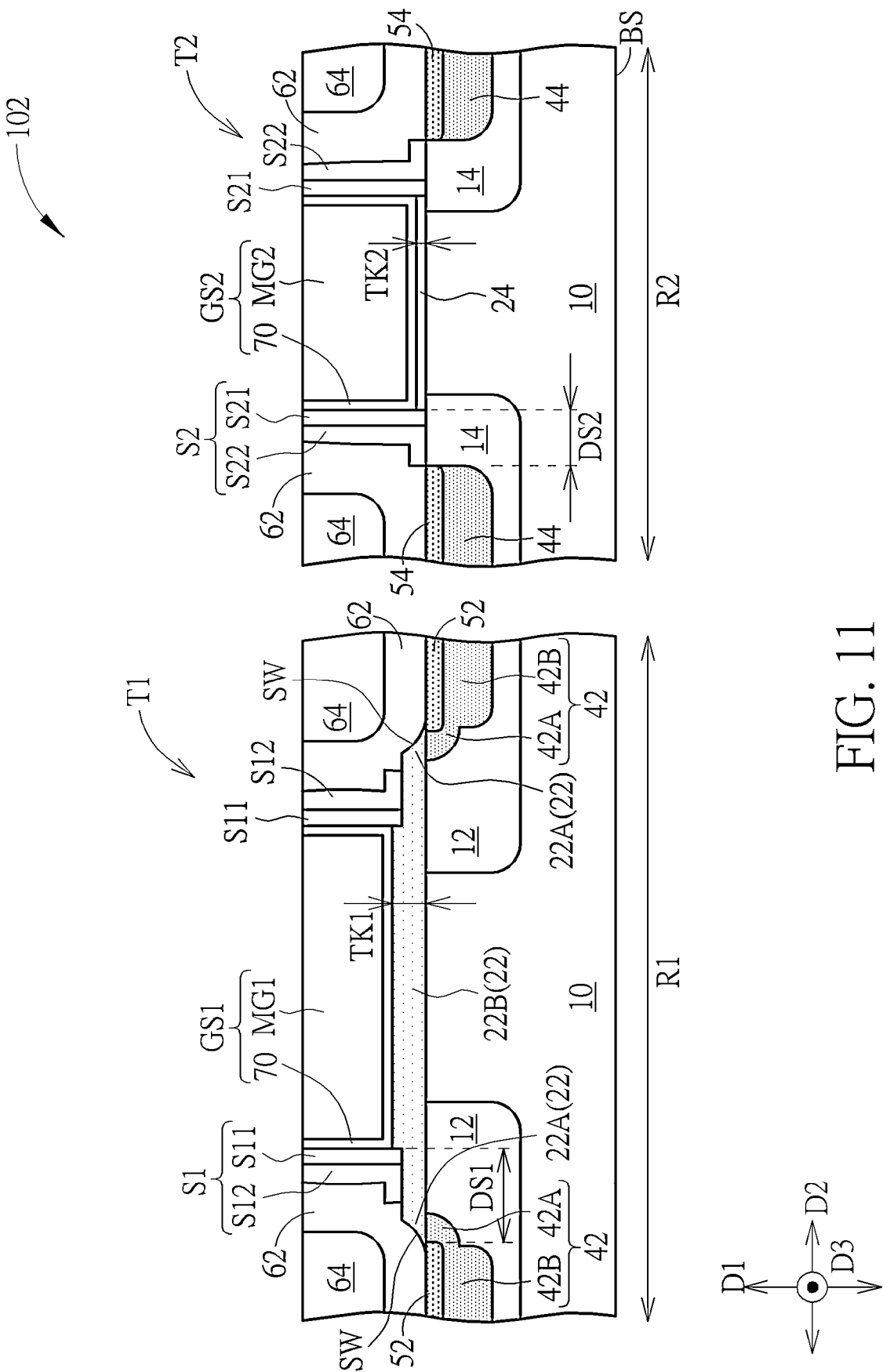
FIG. 11 is a schematic drawing illustrating a semiconductor device according to a second embodiment of the present invention.

Please refer to FIG. 11. FIG. 11 is a schematic drawing illustrating a semiconductor device 102 according to a second embodiment of the present invention. As shown in FIG. 11, in some embodiments, the first metal silicide layer 52 may extend to be partly located in the first portion 42A of the first source/drain doped region 42, a part of the first metal silicide layer 52 may be located under the edge portion 22A of the first gate oxide layer 22 and the sloping sidewall SW in the first direction D1, and the required distance DS1 between the first metal silicide layer 52 and the first gate structure GS1 may still exist for achieving the purpose of reducing the leakage current of the first transistor structure T1.

To summarize the above descriptions, according to the semiconductor device and the manufacturing method thereof in the present invention, the gate oxide layer having the sloping sidewall may be used to improve the leakage current performance of the semiconductor device. In addition, the first gate oxide layer having the sloping sidewall may be formed by the step of removing the oxide layer on the second region and/or the source/drain doped regions in the first region and the second region may be formed concurrently by the same process for process simplification and manufacturing cost reduction.

Those skilled in the art will readily observe that numerous modifications and alterations of the device and method may be made while retaining the teachings of the invention. Accordingly, the above disclosure should be construed as limited only by the metes and bounds of the appended claims

What is claimed is:

1. A manufacturing method of a semiconductor device, comprising:
    forming a first gate oxide layer on a semiconductor substrate, wherein the semiconductor substrate comprises a first region and a second region, the first gate oxide layer is formed on the first region, and the first gate oxide layer comprises:
        a main portion; and
        an edge portion having a sloping sidewall;
    forming a second gate oxide layer on the second region of the semiconductor substrate, wherein a thickness of the first gate oxide layer is greater than a thickness of the second gate oxide layer;
    forming a first dummy gate structure on the first gate oxide layer;
    forming a second dummy gate structure on the second gate oxide layer;
    forming a first spacer structure on a sidewall of the first dummy gate structure, wherein the first spacer structure is formed on the main portion of the first gate oxide layer;
    forming a second spacer structure on a sidewall of the second dummy gate structure;
    forming a first source/drain doped region in the semiconductor substrate, wherein the first source/drain doped region is disposed adjacent to the edge portion of the first gate oxide layer, and the first source/drain doped region comprises:
        a first portion disposed under the edge portion of the first gate oxide layer in a vertical direction; and
        a second portion connected with the first portion;
    forming a second source/drain doped region in the second region of the semiconductor substrate, wherein the second source/drain doped region is located adjacent to the second spacer structure;
    forming a first metal silicide layer, wherein at least a part of the first metal silicide layer is disposed in the second portion of the first source/drain doped region, and the edge portion of the first gate oxide layer is located between the first spacer structure and the first metal silicide layer in a horizontal direction; and
    forming a second metal silicide layer, wherein at least a part of the second metal silicide layer is disposed in the second source/drain doped region, and a first distance between the first metal silicide layer and the first dummy gate structure in the horizontal direction is greater than a second distance between the second metal silicide layer and the second dummy gate structure in the horizontal direction.

2. The manufacturing method of the semiconductor device according to claim 1, wherein the step of forming the first gate oxide layer comprises:
    forming an oxide layer on the first region and the second region; and
    removing the oxide layer formed on the second region and a part of the oxide layer formed on the first region concurrently for forming the first gate oxide layer on the first region.

3. The manufacturing method of the semiconductor device according to claim 2, wherein the second gate oxide layer is formed after the step of removing the oxide layer formed on the second region.

4. The manufacturing method of the semiconductor device according to claim 1, further comprising:
    forming a lightly doped source/drain region in the first region of the semiconductor substrate, wherein the first source/drain doped region is formed in the lightly doped source/drain region, and an impurity concentration of the first source/drain doped region is higher than an impurity concentration of the lightly doped source/drain region.

5. The manufacturing method of the semiconductor device according to claim 1, wherein the sloping sidewall of the edge portion of the first gate oxide layer is formed before the step of forming the first dummy gate structure and the step of forming the first spacer structure.

6. The manufacturing method of the semiconductor device according to claim 1, wherein the first source/drain doped region and the second source/drain doped region are formed concurrently by the same process.

7. The manufacturing method of the semiconductor device according to claim 1, wherein a bottom surface of the first portion of the first source/drain doped region comprises a curved surface disposed under the sloping sidewall of the edge portion of the first gate oxide layer in the vertical direction.

8. The manufacturing method of the semiconductor device according to claim 1, wherein the sloping sidewall of the edge portion of the first gate oxide layer comprises a concave surface.

9. The manufacturing method of the semiconductor device according to claim 1, wherein the first portion of the first source/drain doped region is located between the main portion of the first gate oxide layer and the second portion of the first source/drain doped region in the horizontal direction, and a bottom surface of the second portion is lower than a bottom surface of the first portion in the vertical direction.

* * * * *